US012604422B2

(12) United States Patent
Lam et al.

(10) Patent No.: US 12,604,422 B2
(45) Date of Patent: Apr. 14, 2026

(54) SEPARABLE CONTROL BOX MODULE

(71) Applicant: FLYTECH TECHNOLOGY CO., LTD., Taipei City (TW)

(72) Inventors: Tai-Seng Lam, Taipei City (TW); Hung-Bo Shiue, Taipei City (TW)

(73) Assignee: FLYTECH TECHNOLOGY CO., LTD., Taipei City (TW)

( * ) Notice: Subject to any disclaimer, the term of this patent is extended or adjusted under 35 U.S.C. 154(b) by 97 days.

(21) Appl. No.: 18/647,039

(22) Filed: Apr. 26, 2024

(65) Prior Publication Data

US 2025/0247966 A1     Jul. 31, 2025

(30) Foreign Application Priority Data

Jan. 26, 2024     (TW) ................................. 113103198

(51) Int. Cl.
*H05K 5/00*          (2025.01)
*H05K 5/06*          (2006.01)

(52) U.S. Cl.
CPC ........... *H05K 5/0047* (2013.01); *H05K 5/061* (2013.01)

(58) Field of Classification Search
CPC ...... H05K 5/0047; H05K 5/061; G06F 1/181; G06F 2200/1612; G06F 1/1601
See application file for complete search history.

(56) References Cited

U.S. PATENT DOCUMENTS 11,441,724 B2 *   9/2022   Huang ................... F16M 11/16
2006/0076463 A1 *   4/2006   Drew .................... G06F 1/1601
                                                                248/917

2011/0304972 A1 *   12/2011   Goh .......................... G06F 1/16
                                                                361/679.33
2014/0173310 A1 *   6/2014   Tsuji ..................... G06F 1/3206
                                                                713/320
2015/0042218 A1 *   2/2015   Mevatne ............. H05K 9/0015
                                                                264/263
2019/0258590 A1 *   8/2019   Warkentin ............. G06F 9/452

FOREIGN PATENT DOCUMENTS

CN        212965973 U   *   4/2021
KR        20070102092 A   *   10/2007   .......... G06F 1/1601
TW        M650514 U   *   1/2024

* cited by examiner

*Primary Examiner* — Allen L Parker
*Assistant Examiner* — Keon Kim
(74) *Attorney, Agent, or Firm* — Demian K. Jackson; Jackson IPG PLLC

(57) ABSTRACT

The present invention relates to a separable control box module, which provides a main control circuit board with different specifications to be configured therein and to establish a physical linkage and a unified communication connection with a frontend module with different specifications to form an information system. The separable control box module includes: a first cover including an engaging-fastening linkage module and a mounting structure and attached to the frontend module and an installation point through the engaging-fastening linkage module and the mounting structure, respectively; and the main control circuit board configured in the first cover and including a single internal communication connector, which is configured to be electrically connected with a single internal transmission connector provided by the frontend module, so as to have a unified signal interface with the frontend module.

10 Claims, 7 Drawing Sheets

SEPARABLE CONTROL BOX MODULE

CROSS-REFERENCE TO RELATED APPLICATION

This application claims priority benefit to Taiwan Invention Patent Application Serial No. 113103198, filed on Jan. 26, 2024, in Taiwan Intellectual Property Office, the entire disclosures of which are incorporated by reference herein.

FIELD

The present invention relates to a separable control box module, in particular to a separable control box module capable of being configured with a main control circuit board with different specifications and of establishing a physical linkage and a unified communication connection with a frontend module with different specifications to form an information system.

BACKGROUND

In the current state of the art, all components installed and included in flat panel displays, from flat panel display components to controllers to motherboards, are encapsulated in the same housing, and generally there is a lack of modularized design concept among the components, especially components from different brands are often always incompatible. Therefore, such a traditional structure layout pattern not only lacks flexibility, but also limits agility, and further derives many disadvantages.

Firstly, it is difficult to troubleshoot and replace parts. Due to the lack of modularized design, when a display or controller malfunctions, it is so challenging for an engineer to accurately identify and recognize the specific faulty component. Even if the particular faulty part is identified, it can only be replaced with parts from a specific source. If the spare parts are insufficient or out of stock, the entire repair operations may be thus suspended and pending.

Moreover, there are typically many fine traces and fragile components filled inside displays and controllers, and a group of components is often mounted together and soldered onto the circuit board. If not handled very carefully, it might lead to further damage or malfunction. As a result, replacing parts is both time-consuming and labor-intensive, further complicating the repair issues.

Furthermore, there is also a lack of hardware upgradeability. The components most in need of upgrade within displays are often the processors, memory, and storage media contained within the controllers. However, the controller is encapsulated at the bottom position of the housing. In combination with the above-mentioned factor that components are difficult to replace, all of these factors make hardware upgrades more challenging.

Lastly, for manufacturers, since the product must be bonded to components from specific sources, if there is a shortage of parts, production lines have no other choice to only temporarily suspend production and shipping operation. This production model, dependent on specific conditions, not only increases costs but also limits production flexibility.

Hence, there is a need to solve the above deficiencies/issues.

SUMMARY

The present invention relates to a separable control box module, in particular to a separable control box module capable of being configured with a main control circuit board with different specifications and of establishing a physical linkage and a unified communication connection with a frontend module with different specifications to form an information system.

Accordingly, the present invention provides a separable control box module, which provides a main control circuit board with different specifications to be configured therein and to establish a physical linkage and a unified communication connection with a frontend module with different specifications to form an information system. The separable control box module includes: a first cover including an engaging-fastening linkage module and a mounting structure and attached to the frontend module and an installation point through the engaging-fastening linkage module and the mounting structure, respectively; and the main control circuit board configured in the first cover and including a single internal communication connector, which is configured to be electrically connected with a single internal transmission connector provided by the frontend module, so as to have a unified signal interface with the frontend module.

The above content described in the summary is intended to provide a simplified summary for the presently disclosed invention, so that readers are able to have an initial and basic understanding to the presently disclosed invention. The above content is not aimed to reveal or disclose a comprehensive and detailed description for the present invention, and is never intended to indicate essential elements in various embodiments in the present invention, or define the scope or coverage in the present invention.

DESCRIPTION OF THE DRAWINGS

A more complete appreciation according to the present invention and many of the attendant advantages thereof are readily obtained as the same become better understood by reference to the following detailed description when considered in connection with the accompanying drawing, wherein.

Figure 10:
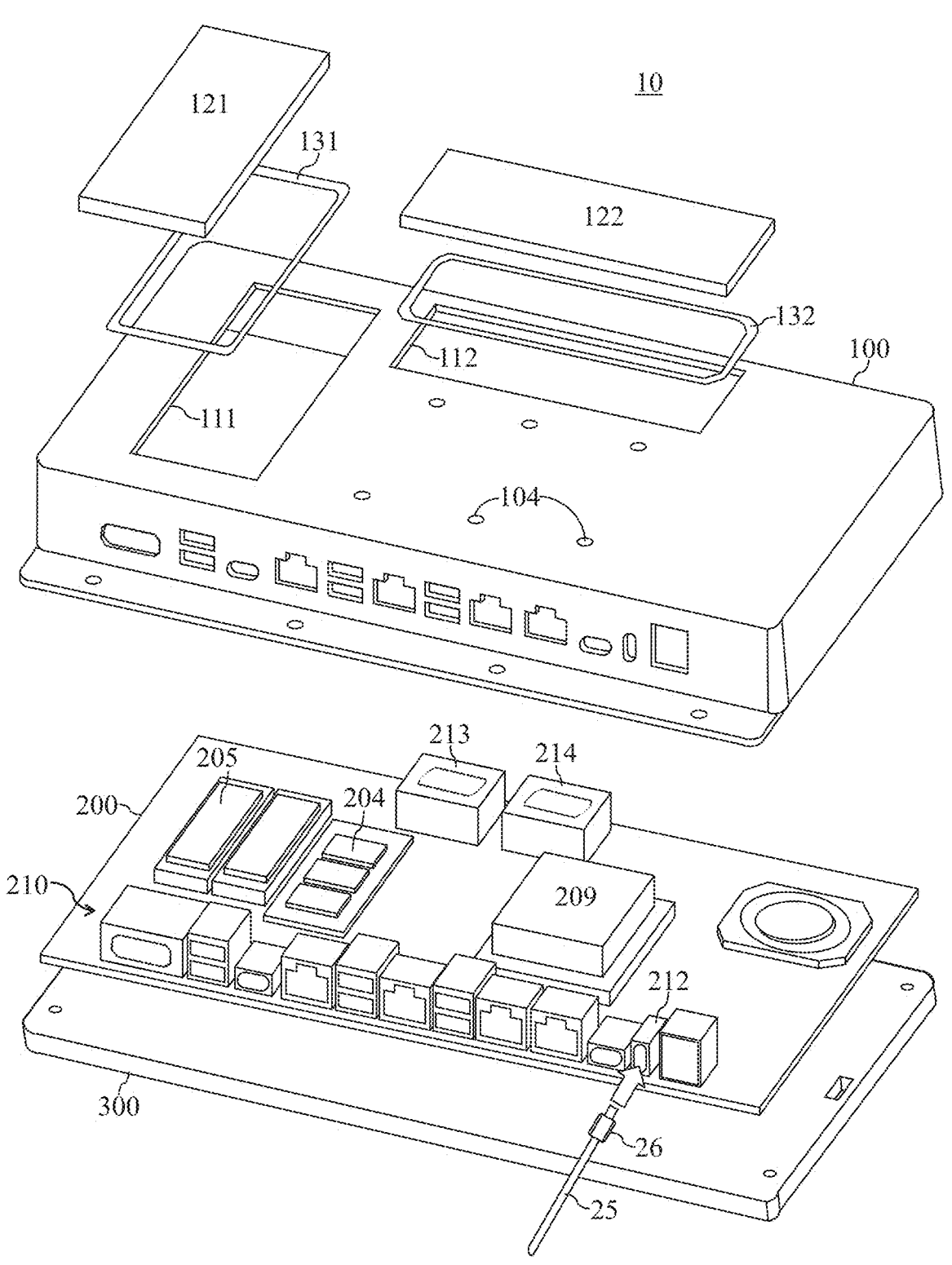
Figure 11:
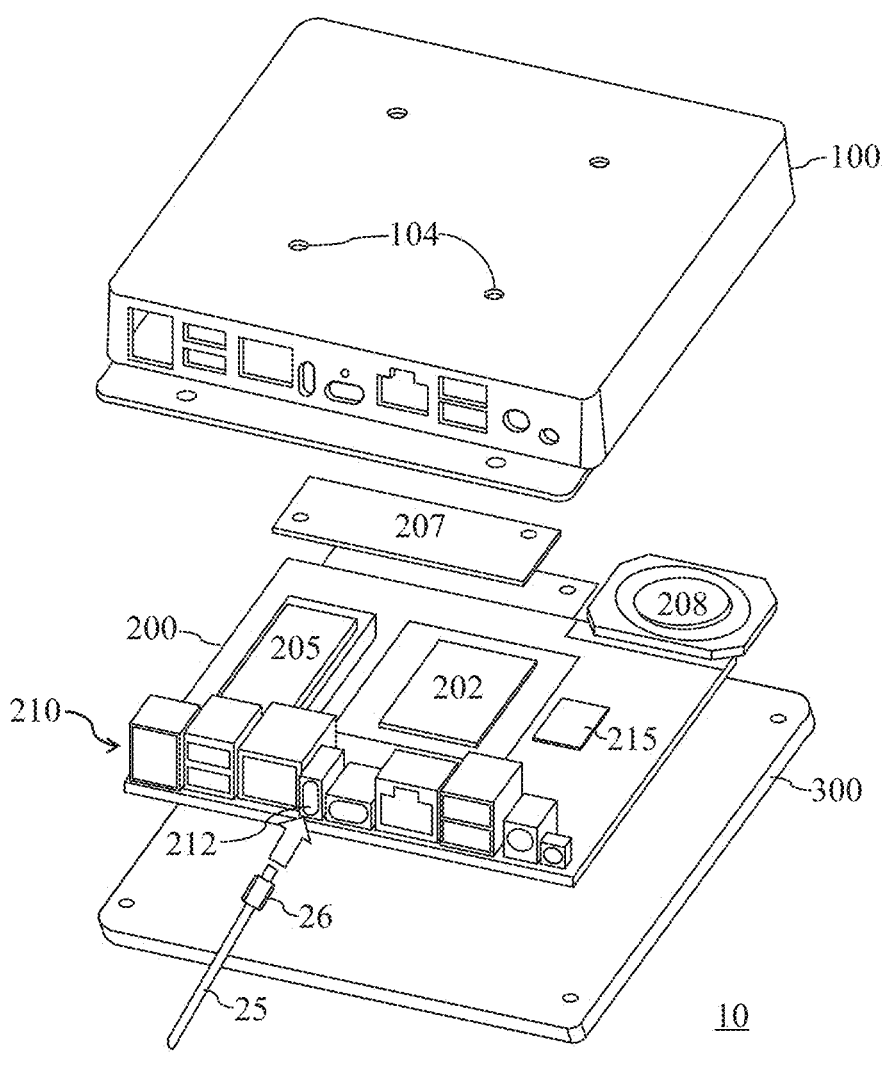

3 physically linked and unifiedly communicatively connected with each other according to the present invention;

FIG. 10 is an exploded-view structural schematic diagram illustrating a second embodiment for the separable control box module included in the present invention; and FIG. 11 is an exploded-view structural schematic diagram illustrating a third embodiment for the separable control box module included in the present invention.

DETAILED DESCRIPTION

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice. It is clear that other embodiments can be configured according to the knowledge of persons skilled in the art without departing from the true technical teaching of the present disclosure, the claimed disclosure being limited only by the terms of the appended claims.

It is to be noticed that the term "including," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device including means A and B" should not be limited to devices consisting only of components A and B.

Figure 1:
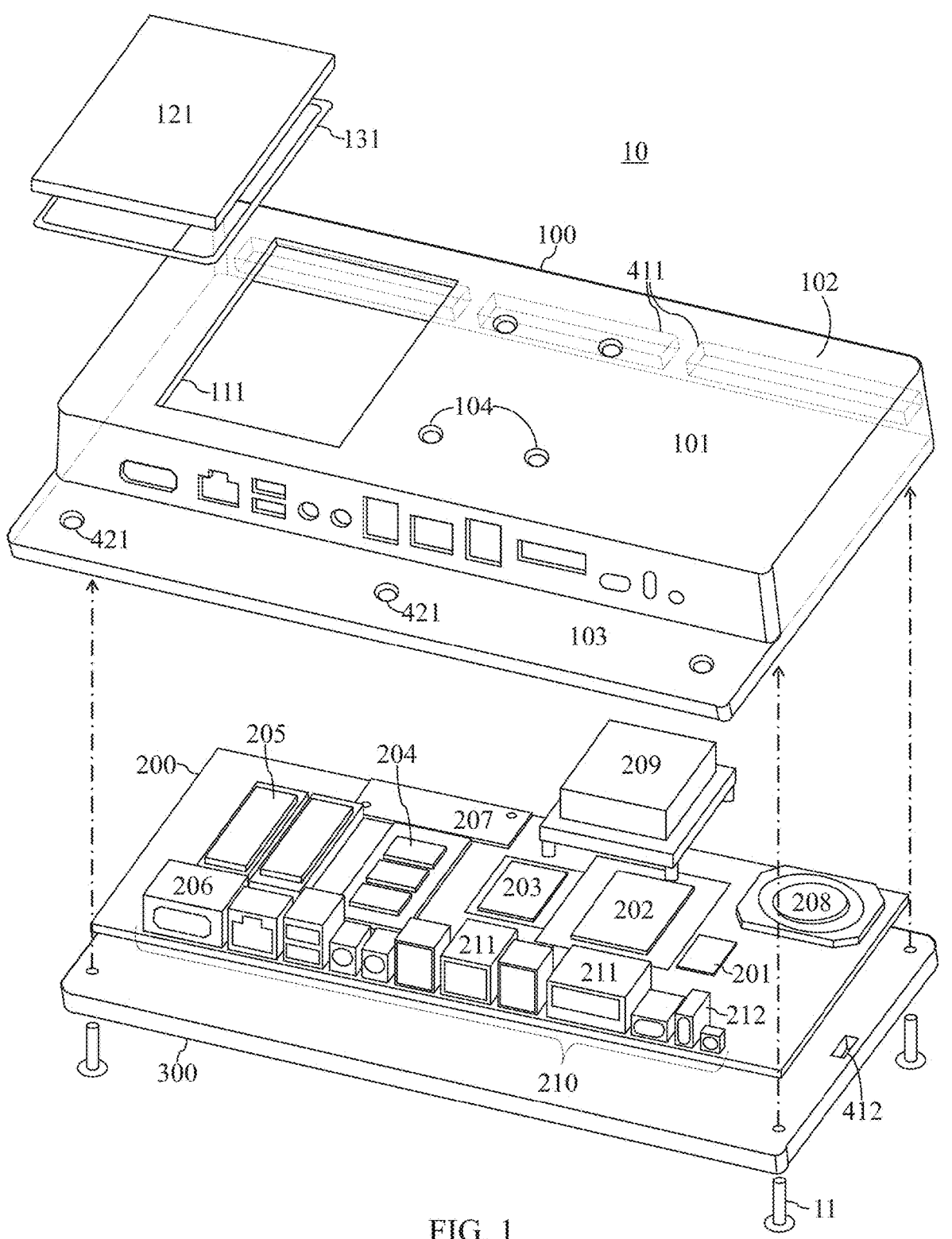
FIG. 1 is an exploded-view structural schematic diagram illustrating a first embodiment for the separable control box module included in the present invention.

FIG. 1 is an exploded-view structural schematic diagram illustrating a first embodiment for the separable control box module included in the present invention. In some embodiments, the separable control box module 10 includes a first cover 100 that functions as a top cover and has a box-like exterior appearance, a main control circuit board 200, and a second cover 300 that functions as a bottom cover. The first cover 100 and the second cover 300 are preferably assembled together via multiple fasteners 11, such as, but not limited to, screws, to form a box-like housing in external appearance and to create a rectangular space inside for configuring the main control circuit board (the motherboard) 200 with different specifications.

Preferably, the different specifications refer to and cover multiple aspects including, but not limited to: different sizes, different brands, different operating principles, different architectures, different performances, different functionalities, different materials, or different sources.

For example, the main control circuit boards 200 with different specifications preferably refer to the main control circuit boards 200 with different operating architectures, covering the functional circuit board products based on x86 or ARM architectures. For example, the main control circuit boards 200 with different specifications preferably refer to the main control circuit boards 200 with different functions, covering the functional circuit board products that provide functionalities including but not limited to: the point of service (POS) function, the tablet PC (the panel PC) function, the medical-grade tablet function, the information kiosk (Kiosk) function, or the self-checkout (SOC) function.

The separable control box module 10 including the main control circuit board 200 is preferably a control box product, that is, the main control circuit board 200 has been already fully assembled with the first cover 100 and the second cover 300, as well as the main control circuit board 200 has been already fully configured with the predetermined different functions, including being capable of driving and controlling the display component, but is not yet physically linked and communicatively connected with the internal display component which is separately configured within the frontend module.

In some embodiments, the main control circuit board 200 is configured with components including, but not limited to, a basic input/output system (BIOS) unit 201, a processor 202, an embedded controller (EC) 203, a random access memory (RAM) 204, a storage medium 205, a power management module 206, a network power supply module 207, a speaker 208, a cooling unit 209, and an aggregation communication interface 210.

The processor 202 is preferably an x86 architecture processor, suitable for high-end models with higher computational demands. The cooling unit 209 is preferably a fan unit or a heat pipe thermal exchange unit to cool down the processor 202. The storage medium 205 is preferably, but not limited to, a solid state drive (SSD), an SD card, or a mechanical hard drive. In addition, the separable control box module 10 is further particularly configured with a speaker 208.

The network power supply module 207 is preferably, but not limited to, a power over Ethernet (POE) module or a power USB module. The aggregation communication interface (I/O aggregation) 210 is a communication interface that integrates various input/output connectors 211 with different specifications into a compact configuration and arrangement on one side of the main control circuit board 200, i.e., aggregately arranged on one side of the first cover 100.

The input/output connectors 211 included in the aggregation communication interface 210 preferably cover, but are not limited to: a single internal communication connector 212, USB transmission connectors, Type-C transfer connectors, HDMI transmission connectors, Ethernet transmission connectors, audio connectors, video connectors, power connectors, VGA connectors, RS232 connectors, or a combination thereof. The single internal communication connector 212 is used to connect with a single internal transmission connector provided by the frontend module through a single transmission line, so as to unify the signal interface between the frontend module and the separable control box module 10.

On the first side 101 included in the first cover 100, a first opening 111 is opened and provided. The position of the first opening 111 on the first cover 100 corresponds to the positions of the memory 204 and the storage medium 205 on the main control circuit board 200, so as to provide for users to easily repair, replace or upgrade the memory 204 and the storage medium 205 as needed.

The first cover 100 preferably includes a first cover plate 121 that has a geometry and a size corresponding to that of the first opening 111, and is configured to close and seal the first opening 111. On the first cover plate 121, a first waterproofing element 131, such as, but not limited to, a waterproofing gasket (an O-ring), is further configured, to prevent moisture and droplets from entering the interior space covered by the first cover 100 through the first opening 111.

On the first side 101 included in the first cover 100, multiple adapter structures 104 are also further configured. The first cover 100 is preferably secured to a specific installation point via these adapter structures 104. The installation point include, but are not limited to, a bracket, a base, a platform, a housing, or a position on a wall.

The adapter structures 104 are preferably, but not limited to: grooves, recesses, protrusions, positioning holes, assembly holes, locating slots, hole positions, openings, blind holes, tenons, clasps, buckles, snap-fits, hooks, slots, pins, ring clasps, push-buttons, snap fasteners, quick-release mechanisms, screws, threaded holes, bolts, nuts, rivets, or spring clips. In some embodiments, the adapter structures 104 are preferably multiple through holes.

The separable control box module 10 is to be physically linked to the frontend module through an engaging-fastening linkage module, which includes multiple components distributed across both the separable control box module 10 and the frontend module. This engaging-fastening linkage module facilitates a secure physical link between the two modules, and enhances the structural integration and functionality.

The engaging-fastening linkage module 400 configured on the separable control box module 10 includes multiple first engaging structures 411 configured on the second side 102 included in the first cover 100, multiple first fastening structures 421 configured on the third side 103 included in the first cover 100, and multiple second engaging structures 412 configured on the second cover 300.

The first engaging structures 411 and the second engaging structures 412 are preferably, but not limited to: grooves, recesses, protrusions, positioning holes, assembly holes, locating slots, hole positions, openings, blind holes, tenons, clasps, fasteners, snap-fits, hooks, slots, pins, ring clasps, push-buttons, snap fasteners, quick-release mechanisms, or spring clips. In some embodiments, the first engaging structures 411 are preferably multiple tenons, and the second engaging structures 412 are preferably multiple slots in the form of blind holes.

The first fastening structures 421 are preferably, but not limited to: positioning holes, assembly holes, hole positions, openings, screws, threaded holes, tapped holes, bolts, nuts, rivets, or spring clips. In some embodiments, the first fastening structures 421 are preferably multiple openings.

Figure 2:
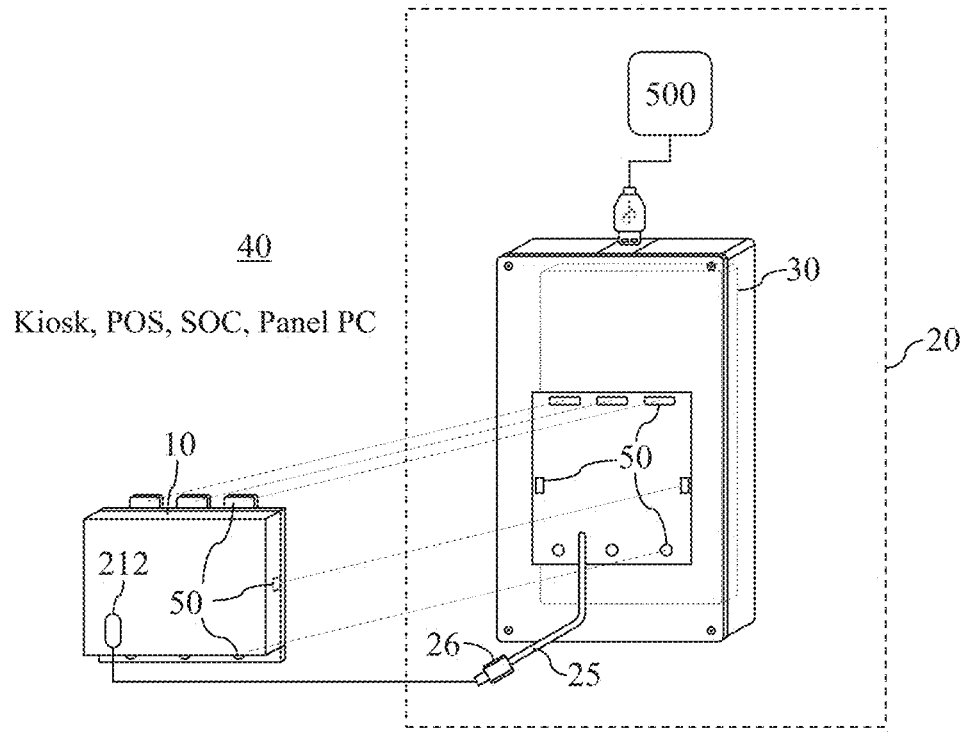
FIG. 2 is a structural schematic diagram illustrating the system architecture for the application-end information system included in the present invention.
Figure 3:
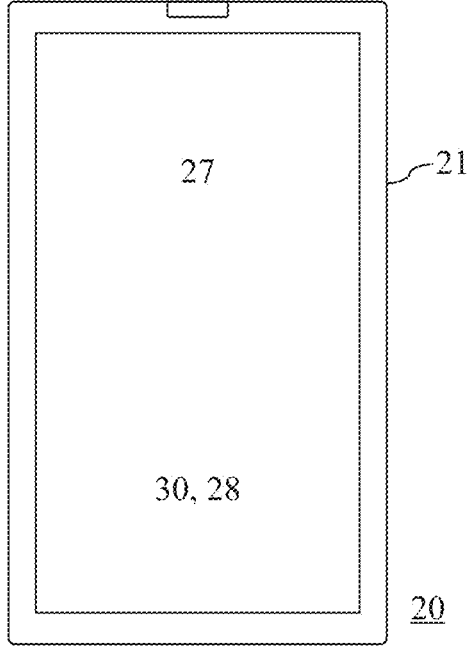
FIG. 3 is a front-view structural schematic diagram illustrating the frontend module included in the present invention.

FIG. 2 is a structural schematic diagram illustrating the system architecture for the application-end information system included in the present invention; and FIG. 3 is a front-view structural schematic diagram illustrating the frontend module included in the present invention. The application-end information system 40 includes the frontend module 20, the display component 30, the separable control box module 10, and the engaging-fastening linkage module 400. The frontend module 20 is configured to accommodate the a variety of display components 30 with different specifications, and further externally connect with other peripheral devices 500 by multiple communication connectors. The peripheral devices 500 include, but are not limited to: scanners, card readers, swipe machines, NFC readers, fingerprint recognizers, printers, cameras, mice, keyboards, speakers, smart buttons (iButtons), secondary displays, biometric recognizers, and electronic payment devices, etc.

The display component 30 is mounted on the first housing 21, and provides digital images for the display surface 28 configured on the front 27 of the frontend module 20 so to present information to users.

The display components 30 are preferably any display products with different specifications available on the market, covering a variety of touch screen products, a variety of touch display products, and a variety of flat panel display products. Preferably, the different specifications refer to and cover multiple aspects including, but not limited to: different sizes, different brands, different operating principles, different architectures, different performances, different functionalities, different materials, or different sources.

The display components 30 with different sizes include, but are not limited to: the available display products with sizes of 10.1 inches, 11.6 inches, 13.3 inches, 14 inches, 15.1 inches, 15.6 inches, 17 inches, 18.5 inches, 21.5 inches, 27 inches, 28 inches to 32 inches, and so on. The display components 30 with different operating principles include, but are not limited to: the LCD display products, the OLED display products, the MicroLED display products, the AMOLED display products, and the plasma display products, etc.

The frontend module 20 is configured at a half front portion of the application-end information system 40, functions as the most front part facing users and forms and shapes the primary visual exterior appearance for the application-end information system 40. The frontend module 20 is principally configured to function as the input and output interface facing users for the application-end information system 40, and to receive input from users and output computation and processing results to users.

The frontend module 20 is inoperative until it establishes an internal communication connection with the separable control box module 10, which functions as the computing and processing core, as well as the display component 30 within the frontend module 20 must begin its electrical operation and display information to the user under the drive and control from the main control circuit board 200 after it has also established the internal communication connection with the main control circuit board 200 inside the separable control box module 10.

The separable control box module 10 configured with the main control circuit board 200 with different specifications, is configured to physically link to the back of the frontend module 20 via the engaging-fastening linkage module 400, and to establish a communication connection with a single internal transmission connector 26 provided by a single transmission line 25 included in the frontend module 20 via a single internal communication connector 212 included in the main control circuit board 200, to enable the frontend module 20 that is compatiable with a variety of the display components 30 with different specifications, and the separable control box module 10 that is compatiable with a variety of the main control circuit boards 200 with different specifications to form a physical linkage and a unified internal communication connection with each other, so as to provide the rapid exchange and combination among a variety of the display components 30 with different specifications and a variety of the separable control box modules 10 with different specifications to form an application-end information system 40 having versatile functionalities.

By exchanging the separable control box modules 10 with different functionalities, the application-end information system 40 is versatilely transformed into a variety of application-end information terminal devices, which include, but are not limited to: POS terminals, tablet PCs, medical-grade tablet PCs, Kiosk stations, and SOC terminals.

Figures 4, 5:
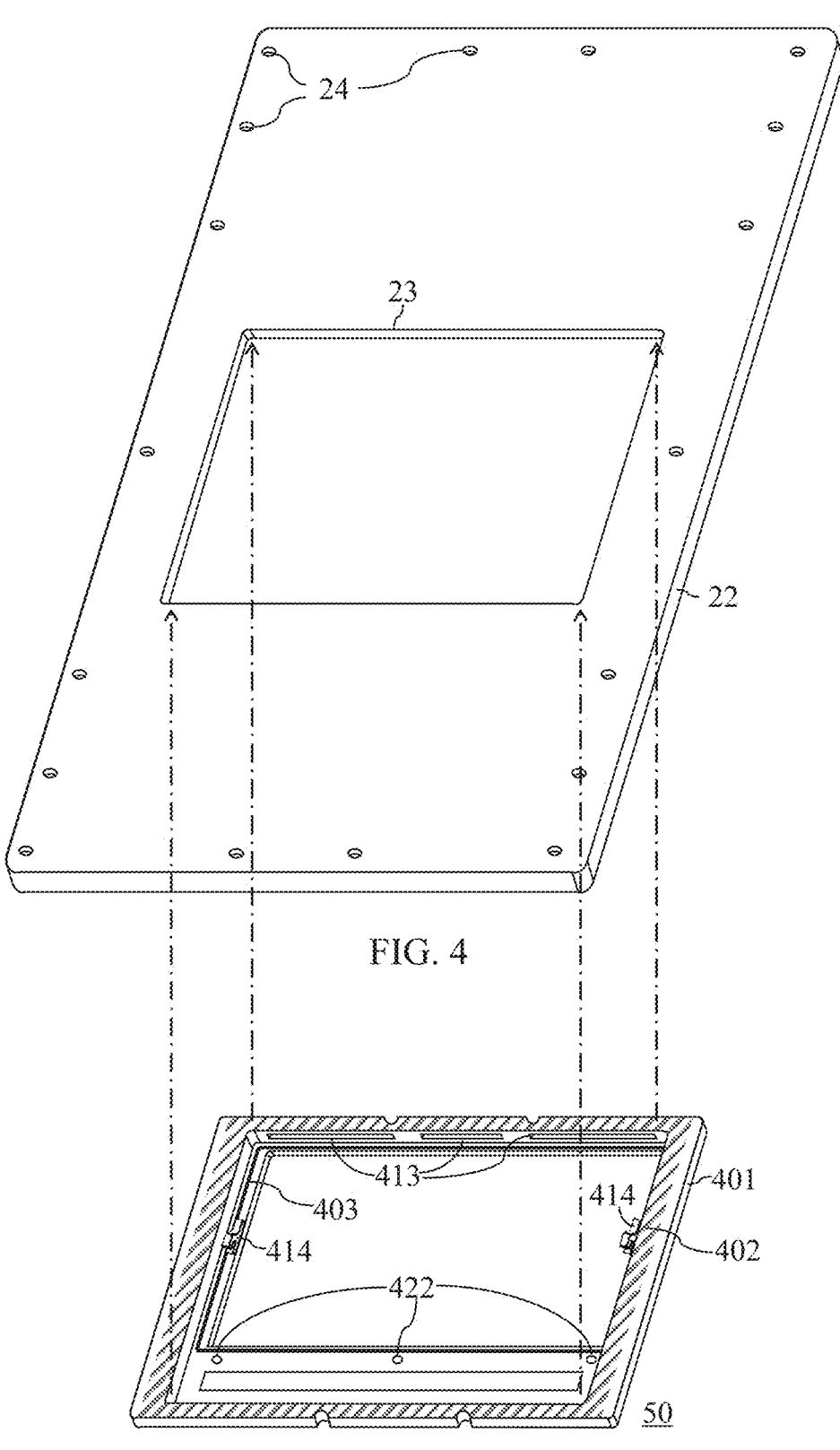
FIG. 4 is a structural schematic diagram illustrating the backplate included in the frontend module according to the present invention.
FIG. 5 is a structural schematic diagram illustrating the engaging-fastening linkage module according to the present invention.

FIG. 4 is a structural schematic diagram illustrating the backplate included in the frontend module according to the present invention; FIG. 5 is a structural schematic diagram illustrating the engaging-fastening linkage module according to the present invention. The frontend module 20 further includes multiple housing parts including the first housing 21 that functions as the front housing and the second housing 22 that functions as the backplate.

The second housing 22 includes a backplate opening 23 in the form of rectangular shape and multiple assembly holes

24. The backplate opening 23 is designed to receive and configure the engaging-fastening linkage module 400 distributed on the frontend module 20, wherein the engaging-fastening linkage module 400 principally includes a linkage substrate 401. The backplate opening 23 preferably has a geometric shape corresponding to the that of the linkage substrate 401, to provide for the linkage substrate 401 to be configured therein.

The linkage substrate 401 is preferably configured within the backplate opening 23 by adhesive bonding or screwing, to be attached to the second housing 22, or to be incorporated into the second housing 102 as an integral part of the second housing.

The engaging-fastening linkage module 400 further includes the third engaging structure 413, the fourth engaging structure 414, and the second fastening structure 422 configured on the linkage substrate 401. The third engaging structure 413 and the fourth engaging structure 414 are preferably, but not limited to: grooves, recesses, protrusions, positioning holes, assembly holes, locating slots, hole positions, openings, blind holes, tenons, clasps, fasteners, snap-fits, hooks, slots, pins, ring clasps, push-buttons, snap fasteners, quick-release mechanisms, or spring clips. In some embodiments, the third engaging structure 413 is preferably multiple slots in the form of blind holes, and the fourth engaging structure 414 is preferably a pair of hooks.

The second fastening structure 422 is preferably, but not limited to: positioning holes, assembly holes, hole positions, openings, screws, threaded holes, tapped holes, bolts, nuts, rivets, or spring clips. In some embodiments, the second fastening structure 422 is preferably multiple tapped holes.

Figure 6:
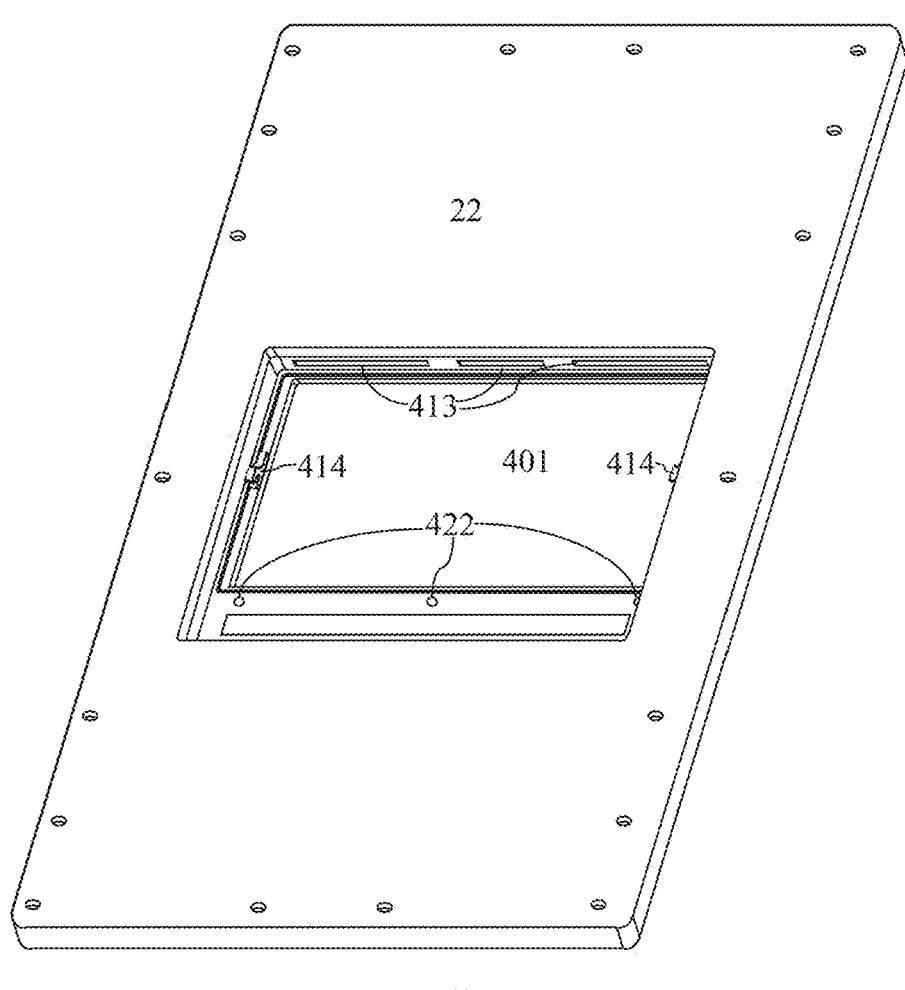
FIG. 6 is a structural schematic diagram illustrating the engaging-fastening linkage module attached to the backplate according to the present invention.

FIG. 6 is a structural schematic diagram illustrating the engaging-fastening linkage module attached to the backplate according to the present invention. The linkage substrate 401 is bonded to the linkage substrate 401 by a layer of waterproofing adhesive 402 applied around the four edges thereof. In order to prevent moisture or droplets from entering and accumulating in the gap existing between the linkage substrate 401 and the bottom cover of the separable control box module 10, a ring of waterproofing gasket 403 is also configured around the position corresponding to the backplate opening 23 on the linkage substrate 401.

After the linkage substrate 401 is successfully bonded to the second housing 22, the ring of waterproofing gasket 403 ensures that the gap formed between the linkage substrate 401 and the bottom cover of the separable control box module 10 is in a water-sealing state, and ensures that moisture and droplets do not infiltrate the internal space of the frontend module 20, when the first housing 21 and the second housing 22 are successfully assembled together, as well as when the separable control box module 10 and the frontend module 20 are successfully assembled together.

In some embodiments, the third engaging structure 413, the fourth engaging structure 414, and the second fastening structure 422 may also be directly formed and fabricated on the second housing 22 by methods such as integral molding or injection molding, to become an integral part of the second housing 22.

Figure 7:
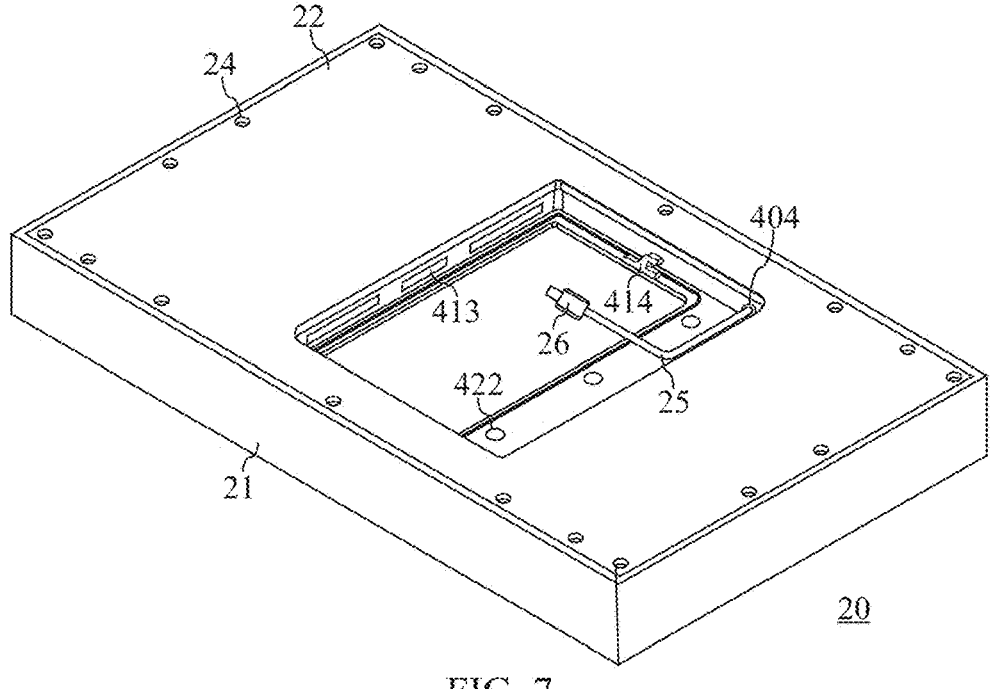
FIG. 7 is a back-view structural schematic diagram illustrating the rear structure for the frontend module included in the present invention.

FIG. 7 is a back-view structural schematic diagram illustrating the rear structure for the frontend module included in the present invention. The second housing 22 and the first housing 21 are preferably assembled by using, for example, but not limited to, screw means. In some embodiments, the first housing 21 includes multiple tapped holes (not shown) corresponding to the multiple assembly holes 24 on the second housing 22, to provide for the second housing 22 to be assembled to the first housing 21 by using multiple screws to form the frontend module 20. The linkage substrate 401 also includes a wiring opening 404 to provide for the single transmission line 25 and the single internal transmission connector 26 included in the frontend module 20 to be exposed therefrom, to establish a communication connection with the single internal communication connector 212 included in the separable control box module 10.

Figure 8:
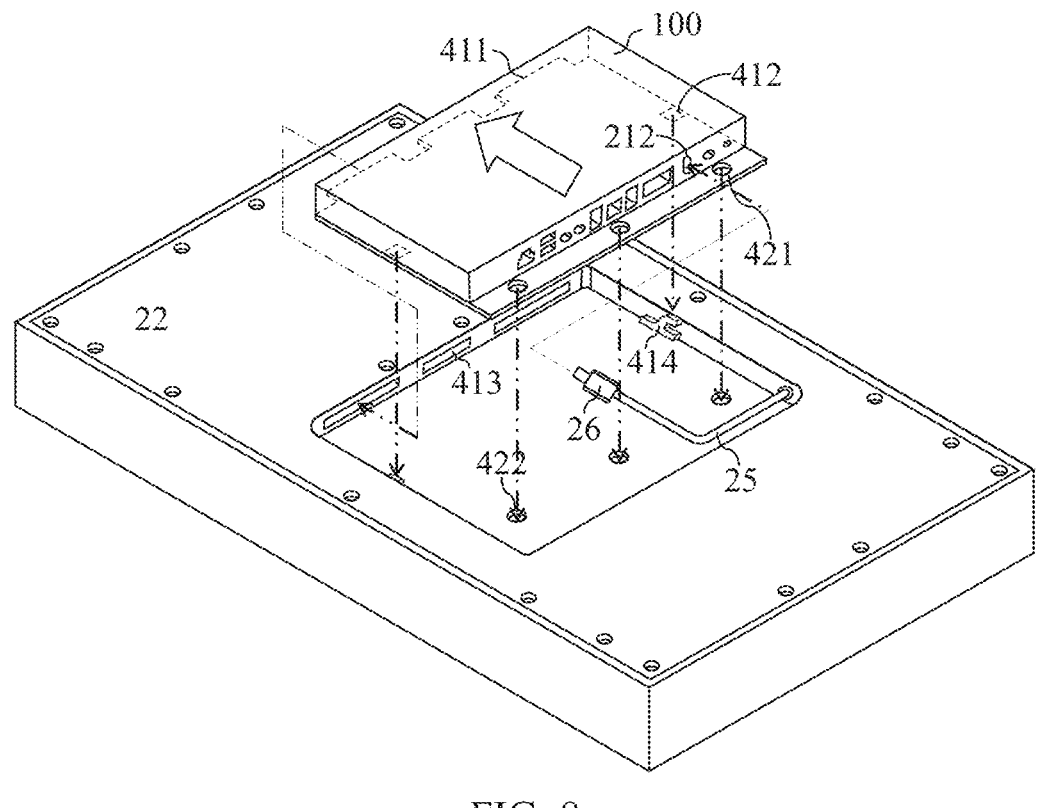
FIG. 8 is a structural schematic diagram illustrating the connection relationship between the separable control box module and the frontend module according to the present invention.
Figure 9:
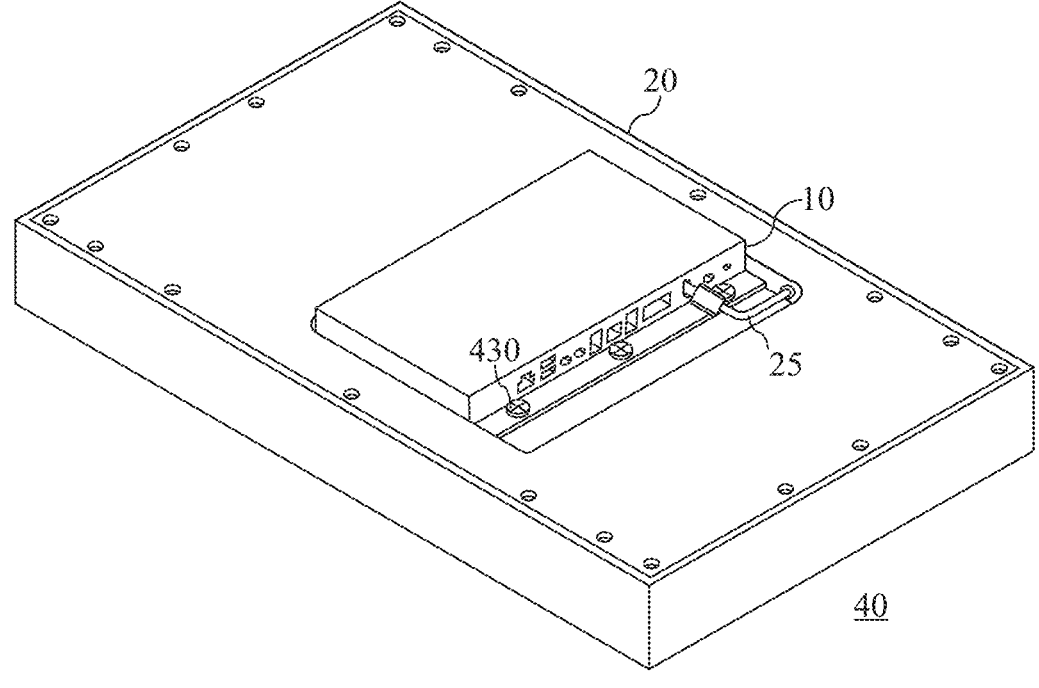
FIG. 9 is a structural schematic diagram illustrating the separable control box and the frontend module which are

FIG. 8 is a structural schematic diagram illustrating the connection relationship between the separable control box module and the frontend module according to the present invention; and FIG. 9 is a structural schematic diagram illustrating the separable control box and the frontend module which are physically linked and unifiedly communicatively connected with each other according to the present invention. The first engaging structure 411, the second engaging structure 412, and the first fastening structure 421 included in the separable control box module 10 are preferably corresponded to the third engaging structure 413, the fourth engaging structure 414, and the second fastening structure 422 included in the frontend module 20, respectively. The first engaging structure 411 is engaged and linked with the third engaging structure 413, the second engaging structure 412 is engaged and linked with the fourth engaging structure 414, and the first fastening structure 421 is secured with the second fastening structure 422, to provide for the separable control box module 10 and the frontend module 20 to be attached and linked to each other.

When the separable control box module 10 is managed to be combined with the frontend module 20, it is only necessary to simply align and insert the multiple second engaging components 412 to the multiple fourth engaging components 414, and then correspondingly, the multiple first engaging components 411 are automatically aligned with the multiple third engaging components 413. Next, by gently moving the separable control box module 10 upward, the multiple first engaging components 411 are automatically inserted into the multiple third engaging components 413, and at the same time, the multiple second engaging components 412 and the multiple fourth engaging components 414 are automatically engaged with each other. Finally, by manually fine-tuning the position of the separable control box module 10 to align the multiple first fastening components 421 with the multiple second fastening components 422, and then using fasteners 430, such as but not limited to screws, to pass through the multiple first fastening components 421 and screw into the multiple second fastening components 422, the separable control box module 10 is securely fastened and installed on the frontend module 20.

As long as the single internal transmission connector 26 included in the frontend module 20 is simply plugged into the corresponding single internal communication connector 212 on the separable control box module 10, a unified and quick communication connection between the separable control box module 10 and the frontend module 20 is formed and enabled by using only a single transmission line 25.

Since the application-end information system 40 including the separable control box module 10 and the frontend module 20 is to be mounted to the installation point by the adapter structures 104 configured on the first cover 100 after the separable control box module 10 and the frontend module 20 are successfully assembled to each other, both the first cover 100 and the second cover 300, especially the first cover 100, must have at least sufficient structural strength capable of supporting the combined weight of the separable control box module 10 and the frontend module 20.

In addition, in consideration of having the heat dissipation and grounding effects for the separable control box module 10, the materials used to manufacture the first cover 100 and the second cover 300, in particular the first cover 100, preferably have a certain degree of heat dissipation ability and grounding effect. Therefore, it is preferable to use metallic materials to manufacture the first cover 100 and the second cover 300, especially the first cover 100. In some embodiments, the first cover 100 is preferably configured and formed with a certain number of heat dissipation fins to improve the heat dissipation capability for the separable control box module 10.

FIG. 10 is an exploded-view structural schematic diagram illustrating a second embodiment for the separable control box module included in the present invention. The second embodiment is based upon and includes the first embodiment. In some embodiments, on the first cover 100 included in the separable control box module 10, in addition to containing a first opening 111 corresponding to the memory 204 and the storage medium 205, a second opening 112 further configured. The position of the second opening 112 on the first cover 100 corresponds to the positions of the second display connector 213 and the third display connector 214 on the main control circuit board 200, so as to provide users with easy external connection to a second display or a third display.

The first cover 100 preferably includes a second cover plate 122 that has a geometry and a size corresponding to that of the second opening 112, and is configured to close and seal the second opening 112. On the second cover plate 122, a second waterproofing element 132, such as, but not limited to, a waterproofing gasket, is also configured to prevent moisture and droplets from infiltrating the interior space covered by the first cover 100 through the second opening 112. Both the first cover 100 and the second cover 300 are fabricated using metallic materials to enhance the durability and performance.

The aggregation communication interface 210 includes the single internal communication connector 212, which is used to connect to the single internal transmission connector 26 provided by a single transmission line 25 included in the frontend module 20, so as to unify the signal interface between the frontend module 20 and the separable control box module 10.

FIG. 11 is an exploded-view structural schematic diagram illustrating a third embodiment for the separable control box module included in the present invention. The third embodiment is based upon and includes the first to the second embodiments. In some embodiments, the processor 202 is preferably a low-power processor based on the ARM architecture, which is characterized by having a low power consumption and a smaller physical size, and is suitable for economic models that require long-time operation but lower computational demands, such as small POS systems or entry-level models. In correspondence with the ARM architecture, the main control circuit board 200 further includes a unified extensible firmware interface (UEFI) unit 215.

In some embodiments, the aggregation communication interface 210 also includes the single internal communication connector 212, which is used to connect to the single internal transmission connector 26 provided by a single transmission line 25 included in the frontend module 20, so as to unify the signal interface between the frontend module 20 and the separable control box module 10. Both the first cover 100 and the second cover 300 are fabricated using metallic materials to enhance the durability and performance.

As compared to traditional information systems in which the entire display component, the speaker, and the entire main control circuit board including the processor, the memory, and the storage media are all encapsulated in the same housing, making the entire information system difficult to maintain and upgrade, the present invention modularizes the main control circuit board and the display component for modular configuration, and then separates the main control circuit board and the display component after modularization.

In the present invention, various electronic components including the main control circuit board 200 are separately deployed in a separate control box module 10 that is separated from the fronted module 20 containing the display component 30, so that various display components 30 with different sizes and different operating principles from different manufacturers, as well as the separate control box module 10 with different architectures, different performance and different sizes from different manufacturers, are compatible with each other and can be quickly assembled together to form various application-end information systems 40.

For example, even large-sized display panels can be flexibly matched with smaller or lower-level control boxes according to different tasks without any restrictions; conversely, small-sized panels can also be flexibly matched with high-level control boxes according to different tasks. Users can also upgrade the control box at any time without changing the display panel, which helps reduce system construction costs for users. In addition, users can switch the control box to a low-power ARM architecture control box at any time.

Moreover, the separable control box module 10 provided in the invention is also specifically designed to configure multiple maintenance openings and covers where corresponding to components that require frequent replacement or upgrade, such as memory, storage media, the second and third display connectors, to provide for users to easily upgrade or replace SSDs or SD cards, thereby improving the efficiency for component maintenance and replacement task.

Furthermore, since the main control circuit board 200 is to be independently formed into a separate control box when various electronic components fail or need to be upgraded, compared to traditional information systems that require disassembly of the entire large system, especially for security considerations, traditional information systems prefer to encapsulate the electronic controller at the bottom of the housing, which makes maintenance difficult. The present invention requires only a simple disassembly of the control box to remove the main control board 200 for repairing or upgrading various electronic components.

For example, subject to the modularization system architecture according to the present invention, a user who wishes to improve system performance with limited budget may simply choose to replace or upgrade only the processor, which is sufficient enough to significantly boost up overall system performance.

Thus, based on the above-mentioned advantages that the separable control box owns, the present invention further integrates speakers that are prone to failure onto the main control circuit board. As compared to the traditional information systems, the speakers become much easier to repair and upgrade.

For the production end, when assembling the application-end information system 10 provided by the present invention, various display components 200 with different sizes and operating principles from different manufacturers, various peripheral devices 800 with different specifications, and control box modules 400 with different architectures, performance, and sizes from different manufacturers can be flexibly matched, so that the assembly and production for the application-end information systems 10 is not affected by material shortages or supply-side restrictions.

For maintenance and consumer ends, the advantages raised in the present invention are significant. When various components included in the information system 10, from display components 200, various peripheral devices 800 to control box modules 400, fail, malfunction or need to be upgraded, other components with different specifications can be freely replaced in a timely manner, completely unaffected by material shortages or supply-side restrictions.

In summary, the present invention provides a motherboard box or a processor box, packaged with or not with a PC. The components configured inside the box contains, but are not limited to, a motherboard, memory, storage, speakers, switches, coolers, or fans, these components. The present interchangeable box is designed to form a controller for various POS, kiosk, panel PC applications, etc., to achieve the effects as follows:

(1) Modularization design enhances design and product development efficiency; (2) Replaceable box facilitates maintenance; (3) Replaceable box facilitates computer upgrades; (4) Storage of boxes facilitates inventory control; (5) Easy to assembly supports customized shipments; (6) Integration of coolers, heat pipes, air cooling, or other specified cooling devices within the same box facilitates replacement operation; and (7) Particularly suitable for commercial information systems.

The present invention not only streamlines the design and production processes but also significantly enhances the flexibility, maintainability, and upgradeability for application-end information systems, rendering it particularly beneficial for commercial applications.

There are further embodiments provided as follows.

Embodiment 1: A separable control box module, which provides a main control circuit board with different specifications to be configured therein and to establish a physical linkage and a unified communication connection with a frontend module with different specifications to form an information system, includes: a first cover including an engaging-fastening linkage module and a mounting structure and attached to the frontend module and an installation point through the engaging-fastening linkage module and the mounting structure, respectively; and the main control circuit board configured in the first cover and including a single internal communication connector, which is configured to be electrically connected with a single internal transmission connector provided by the frontend module, so as to have a unified signal interface with the frontend module.

Embodiment 2: The separable control box module as described in Embodiment 1, further includes: a second cover assembled with the first cover by a plurality of fasteners; the main control circuit board further including one of a basic input/output system (BIOS) unit, a unified extensible firmware interface (UEFI) unit, a processor, a network power supply module, an embedded controller, a memory, a storage medium, a power management module, a speaker, a cooling unit, a second display connector, and an aggregation communication interface; the aggregation communication interface including a plurality of input/output connectors with different specifications and the single internal communication connector, which are aggregated and compactly arranged on one side of the main control circuit board, so as to be aggregately arranged on a single side of the first cover;

and the processor configured to provide an internal control signal to the frontend module through the single internal communication connector.

Embodiment 3: The separable control box module as described in Embodiment 2, the first cover further includes: a first opening configured on the first cover where corresponds to the position of the memory or the storage medium included in the main control circuit board; a first cover plate configured to seal the first opening; and a first waterproofing component configured between the first cover plate and the first opening.

Embodiment 4: The separable control box module as described in Embodiment 2, the first cover further includes: a second opening configured on the first cover where corresponds to the position of the second display connector included in the main control circuit board; a second cover plate configured to seal the second opening; and a second waterproofing component configured between the second cover plate and the second opening.

Embodiment 5: The separable control box module as described in Embodiment 1, the first cover has a structural strength and a cooling capacity to support the combined weight of the separable control box module and the frontend module.

Embodiment 6: The separable control box module as described in Embodiment 5, the first cover further includes one of a metallic material, a plastic material, and a combination thereof.

Embodiment 7: The separable control box module as described in Embodiment 2, the engaging-fastening linkage module further includes: on the first cover or the second cover: a first engaging structure configured on the first cover or the second cover and corresponding to a third engaging structure included in the frontend module; a first fastening structure configured on the first cover or the second cover and corresponding to a second fastening structure included in the frontend module; on the frontend module: the third engaging structure configured on a second housing included in the frontend module; and the second fastening structure configured on the second housing included in the frontend module.

Embodiment 8: The separable control box module as described in Embodiment 7, the engaging-fastening linkage module further includes: on the first cover or the second cover: a second engaging structure configured on the first cover or the second cover and corresponding to a fourth engaging structure included in the frontend module; on the frontend module: the fourth engaging structure configured on a second housing included in the frontend module.

Embodiment 9: The separable control box module as described in Embodiment 2, the network power supply module is a power over ethernet (PoE) module or a USB power supply module.

Embodiment 10: The separable control box module as described in Embodiment 1, the processor is an x86 architecture processor or an ARM architecture processor.

While the disclosure has been described in terms of what are presently considered to be the most practical and preferred embodiments, it is to be understood that the disclosure need not be limited to the disclosed embodiments. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present disclosure which is defined by the appended claims.

What is claimed is:

1. A separable control box module, which provides a main control circuit board with different specifications to be configured therein and to establish a physical linkage and a unified communication connection with a frontend module with different specifications to form an information system, comprising:

a first cover comprising an engaging-fastening linkage module and a mounting structure and attached to the frontend module and an installation point through the engaging-fastening linkage module and the mounting structure, respectively;

a second cover assembled with the first cover by a plurality of fasteners; and the main control circuit board configured in the first cover and comprising a single internal communication connector, which is configured to be electrically connected with a single internal transmission connector provided by the frontend module, so as to have a unified signal interface with the frontend module, wherein the engaging-fastening linkage module comprises:

a first engaging structure in a form of a tenon configured on the first cover and corresponding to a third engaging structure in a form of a locating slot comprised in the frontend module;

a second engaging structure in a form of a slot configured on the second cover and corresponding to a fourth engaging structure in a form of a hook comprised in the frontend module; and a first fastening structure in a form of a through hole configured on the first cover, corresponding to a second fastening structure in a form of a tapped hole comprised in the frontend module and comprising a fastener in a form of a screw, whereby the hook and the tenon are configured to first align with and be inserted into the slot and the locating slot, respectively, the separable control box module is then configured to be moved upward to cause the hook and the tenon to be automatically engaged with the slot and the locating slot to form a floating engagement capable of supporting the weight of the separable control box module without external support and maintaining alignment prior to fastening, thereby enabling the screw to pass through the through hole into the tapped hole to securely fasten the separable control box module onto the frontend module.

2. The separable control box module as claimed in claim 1, further comprising:

the main control circuit board further comprising one of a basic input/output system (BIOS) unit, a unified extensible firmware interface (UEFI) unit, a processor, a network power supply module, an embedded controller, a memory, a storage medium, a power management module, a speaker, a cooling unit, a second display connector, and an aggregation communication interface;

the aggregation communication interface comprising a plurality of input/output connectors with different specifications and the single internal communication connector, which are aggregated and compactly arranged on one side of the main control circuit board, so as to be aggregately arranged on a single side of the first cover; and the processor configured to provide an internal control signal to the frontend module through the single internal communication connector.

3. The separable control box module as claimed in claim 2, wherein the first cover further comprises:

a first opening configured on the first cover where corresponds to the position of the memory or the storage medium comprised in the main control circuit board;

a first cover plate configured to seal the first opening; and a first waterproofing component configured between the first cover plate and the first opening.

4. The separable control box module as claimed in claim 2, wherein the first cover further comprises:

a second opening configured on the first cover where corresponds to the position of the second display connector comprised in the main control circuit board;

a second cover plate configured to seal the second opening; and a second waterproofing component configured between the second cover plate and the second opening.

5. The separable control box module as claimed in claim 2, wherein the engaging-fastening linkage module further comprises:

on the frontend module:

the third engaging structure configured on a second housing comprised in the frontend module; and the second fastening structure configured on the second housing comprised in the frontend module.

6. The separable control box module as claimed in claim 5, wherein the engaging-fastening linkage module further includes:

on the frontend module:

the fourth engaging structure configured on a second housing comprised in the frontend module.

7. The separable control box module as claimed in claim 2, wherein the network power supply module is a power over ethernet (PoE) module or a USB power supply module.

8. The separable control box module as claimed in claim 1, wherein the first cover has a structural strength and a cooling capacity to support the combined weight of the separable control box module and the frontend module.

9. The separable control box module as claimed in claim 8, wherein the first cover further comprises one of a metallic material, a plastic material, and a combination thereof.

10. The separable control box module as claimed in claim 1, wherein the processor is an x86 architecture processor or an ARM architecture processor.

* * * * *